United States Patent
Gan et al.

(10) Patent No.: US 7,576,426 B2
(45) Date of Patent: Aug. 18, 2009

(54) WAFER LEVEL PACKAGE INCLUDING A DEVICE WAFER INTEGRATED WITH A PASSIVE COMPONENT

(75) Inventors: Qing Gan, Fremont, CA (US); Robert W. Warren, Newport Beach, CA (US); Anthony J. Lobianco, Irvine, CA (US); Steve X. Liang, San Diego, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 255 days.

(21) Appl. No.: 11/097,646

(22) Filed: Apr. 1, 2005

(65) Prior Publication Data

US 2006/0220173 A1    Oct. 5, 2006

(51) Int. Cl.
*H01L 23/10* (2006.01)
*H01L 23/48* (2006.01)

(52) U.S. Cl. ................. 257/710; 257/777; 257/E23.011

(58) Field of Classification Search ................. 257/710, 257/E23.005, E23.128, E23.181, 777
See application file for complete search history.

(56) References Cited

U.S. PATENT DOCUMENTS

| | | | |
|---|---|---|---|
| 5,323,051 A | 6/1994 | Adams et al. | |
| 5,448,014 A * | 9/1995 | Kong et al. | 174/539 |
| 5,757,072 A * | 5/1998 | Gorowitz et al. | 257/700 |
| 6,057,597 A | 5/2000 | Farnworth et al. | |
| 6,214,644 B1 | 4/2001 | Glenn | |
| 6,297,072 B1 | 10/2001 | Tilmans et al. | |
| 6,376,280 B1 | 4/2002 | Ruby et al. | |
| 6,380,616 B1 | 4/2002 | Tutsch et al. | |
| 6,399,426 B1 | 6/2002 | Capote et al. | |
| 6,402,970 B1 | 6/2002 | Lin | |
| 6,498,114 B1 | 12/2002 | Amundson | |
| 6,530,515 B1 | 3/2003 | Glenn et al. | |

(Continued)

FOREIGN PATENT DOCUMENTS

JP    2004072071    3/2004

(Continued)

OTHER PUBLICATIONS

K. C. Eun et al., "Fully Embedded LTCC Spiral Inductors Incorporating Air Cavity for High Q-factor and SRF," IEEE Electronic Components and Technology Conference, vol. 1, Jun. 1-4, 2004, pp. 1101-1103.

(Continued)

*Primary Examiner*—David S Blum
(74) *Attorney, Agent, or Firm*—Lando & Anastasi, LLP (57) ABSTRACT

According to an exemplary embodiment, a wafer level package includes a device wafer including at least one device wafer contact pad and a device, and where the at least one device wafer contact pad is electrically connected to the device. The wafer level package includes a first polymer layer situated over the device wafer. The wafer level package includes at least one passive component situated over the first polymer layer and having a first terminal and a second terminal. The first terminal of the at least one passive component is electrically connected to the at least one device wafer contact pad. The wafer level package includes a second polymer layer situated over the at least one passive component. The wafer level package includes at least one polymer layer contact pad situated over the second polymer layer and electrically connected to the second terminal of the at least one passive component.

16 Claims, 8 Drawing Sheets

U.S. PATENT DOCUMENTS

| | | | |
|---|---|---|---|
| 6,566,745 B1 * | 5/2003 | Beyne et al. | 257/680 |
| 6,630,725 B1 | 10/2003 | Kuo et al. | |
| 6,743,656 B2 | 6/2004 | Orcutt et al. | |
| 6,743,991 B1 * | 6/2004 | Wong et al. | 200/182 |
| 6,767,764 B2 * | 7/2004 | Saia et al. | 438/118 |
| 6,777,263 B1 | 8/2004 | Gan et al. | |
| 6,787,897 B2 | 9/2004 | Geefay et al. | |
| 6,794,739 B2 | 9/2004 | Kobayashi et al. | |
| 6,800,508 B2 | 10/2004 | Kimura | |
| 6,838,309 B1 | 1/2005 | McCann | |
| 6,953,999 B2 | 10/2005 | Stranberg et al. | |
| 7,045,868 B2 | 5/2006 | Ding et al. | |
| 7,059,048 B2 | 6/2006 | Koning et al. | |
| 7,203,394 B2 | 4/2007 | Wiegele et al. | |
| 7,268,436 B2 | 9/2007 | Aigner et al. | |
| 2003/0155643 A1 | 8/2003 | Freidhoff | |
| 2004/0063249 A1 | 4/2004 | Lin et al. | |
| 2004/0077154 A1 | 4/2004 | Nagarajan et al. | |
| 2004/0259325 A1 | 12/2004 | Gan | |
| 2005/0054133 A1 | 3/2005 | Felton et al. | |
| 2006/0126313 A1 * | 6/2006 | Steiner et al. | 361/760 |
| 2006/0194361 A1 * | 8/2006 | Heck et al. | 438/48 |
| 2006/0211233 A1 | 9/2006 | Gan et al. | |
| 2007/0158787 A1 * | 7/2007 | Chanchani | 257/619 |
| 2007/0274058 A1 | 11/2007 | Cousin | |
| 2008/0003761 A1 | 1/2008 | Gan et al. | |
| 2008/0064142 A1 | 3/2008 | Gan et al. | |
| 2008/0217708 A1 | 9/2008 | Reisner et al. | |

OTHER PUBLICATIONS

M. Franosch, "Wafer-Level-Package for Bulk Acoustic Wave (BAW) Filters," IEEE Microwaves Symposium, vol. 2, Jun. 6-11, 2004, pp. 493-496.

Young Chul Lee et al., "Monolithic LTCC SiP Transmitter for 60GHz Wireless Communication Terminals," IEEE Microwaves Symposium, Jun. 17, 2005, pp. 1015-1018.

* cited by examiner

Fig. 2G

WAFER LEVEL PACKAGE INCLUDING A DEVICE WAFER INTEGRATED WITH A PASSIVE COMPONENT

BACKGROUND OF THE INVENTION

1. Field of the Invention

The present invention is generally in the field of semiconductors. More particularly, the invention is in the field of wafer level packaging.

2. Background Art

Electronic devices, such as cellular phones and personal digital assistants (PDAs), continue to decrease in size and price and increase in functionality. As a result, these electronic devices require smaller, lower cost components, such as integrated circuits (ICs) and Micro-Electro-Mechanical Systems (MEMS) devices. However, packaging generally consumes between approximately 40.0 percent and approximately 90.0 percent of the total manufacturing cost of the ICs and MEMS devices. As a result, wafer level packaging has emerged as a leading solution to the challenge of providing low cost IC and MEMS device packages that also have a reduced footprint.

In wafer level packaging processes, a layer of polymer material may be used to bond a cap wafer to a device wafer, which may include ICs or MEMS devices, to reduce cost. However, most polymer based wafer level packages do not provide a hermetic seal, which is required in certain applications. To achieve a hermetic seal, a thin metal layer, such as gold, gold-based alloys, copper, copper-based alloys, or solder, may be used to form a bonding layer to bond the cap wafer to the device wafer. However, the use of the metal bonding layer undesirably increases manufacturing cost.

Additionally, passive components, such as inductors, resistors, and capacitors, are generally required for matching IC and MEMS devices, such as Radio Frequency (RF) IC and RF MEMS devices, in wafer level packages. In one conventional packaging process, the passive components are built in a multi-layer printed circuit board (PCB) substrate and packaged with the wafer level package, which requires the additional cost of another package level to achieve a stand-alone device. In another conventional packaging process, passive components are built on the surface of a PCB, which undesirably consumes additional package space.

Thus, there is a need in the art for a low cost, hermetically sealed wafer level package including a device on a device wafer, where the device can be coupled to a passive component external to the device wafer without undesirably increasing the package footprint.

SUMMARY OF THE INVENTION

The present invention is directed to a wafer level package including a device wafer integrated with a passive component. The present invention addresses and resolves the need in the art for a low cost, hermetically sealed wafer level package including a device on a device wafer, where the device can be coupled to a passive component external to the device wafer without undesirably increasing the package footprint.

According to an exemplary embodiment, a wafer level package includes a device wafer, where the device wafer includes at least one device wafer contact pad and at least one device, and where the at least one device wafer contact pad is electrically connected to the at least one device. The wafer level package also includes a first polymer layer situated over the device wafer. The first polymer layer can include an opening, where the opening forms a cavity for the at least one device, for example. The wafer level package further includes at least one passive component situated over the first polymer layer, where the at least one passive component has a first terminal and a second terminal. The first terminal of the at least one passive component is electrically connected to the at least one device wafer contact pad. The wafer level package further includes a first conductive via situated in the first polymer layer, where the first conductive via electrically connects the first terminal of the at least one passive component to the at least one device wafer contact pad. The wafer level package further includes a second polymer layer situated over the at least one passive component.

According to this exemplary embodiment, the wafer level package further includes at least one polymer layer contact pad situated over the second polymer layer, where the at least one polymer contact pad is electrically connected to the second terminal of the at least one passive component. The wafer level package further includes a second conductive via situated in the second polymer layer, where the second conductive via is electrically connected to the second terminal of the at least one passive component. The wafer level package may include a solder bump, where the solder bump is situated on the at least one polymer contact pad. The wafer level package may further include a metal seal ring situated in the first polymer layer and the second polymer layer, for example.

The device wafer can include a metal device wafer ring, where the metal device wafer ring surrounds the device and can be connected to the metal seal ring. The wafer level package may further include a passivation layer situated over the second polymer layer, where the passivation layer and the metal seal ring provide a hermetic seal for the wafer level package. According to one embodiment, the invention is a method for fabricating the above-described wafer level package. Other features and advantages of the present invention will become more readily apparent to those of ordinary skill in the art after reviewing the following detailed description and accompanying drawings.

DETAILED DESCRIPTION OF THE INVENTION

The present invention is directed to a wafer level package including a device wafer integrated with a passive component. The following description contains specific information pertaining to the implementation of the present invention. One skilled in the art will recognize that the present invention may be implemented in a manner different from that specifically discussed in the present application. Moreover, some of the specific details of the invention are not discussed in order to not obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention which use the principles of the present invention are not specifically described in the present application and are not specifically illustrated by the present drawings.

The present invention provides a wafer level package that effectively integrates passive components and a device wafer without undesirably increasing the package footprint. As will be discussed in detail below, the present invention's wafer level package includes passive components formed between polymer layers, which are formed over the device wafer. Although a wafer level package having only two polymer layers and two passive components is described herein to illustrate the present invention, the present invention's innovative process can be applied to provide a wafer level package having more than two polymer layers and passive components situated over a device wafer.

Figure 1:
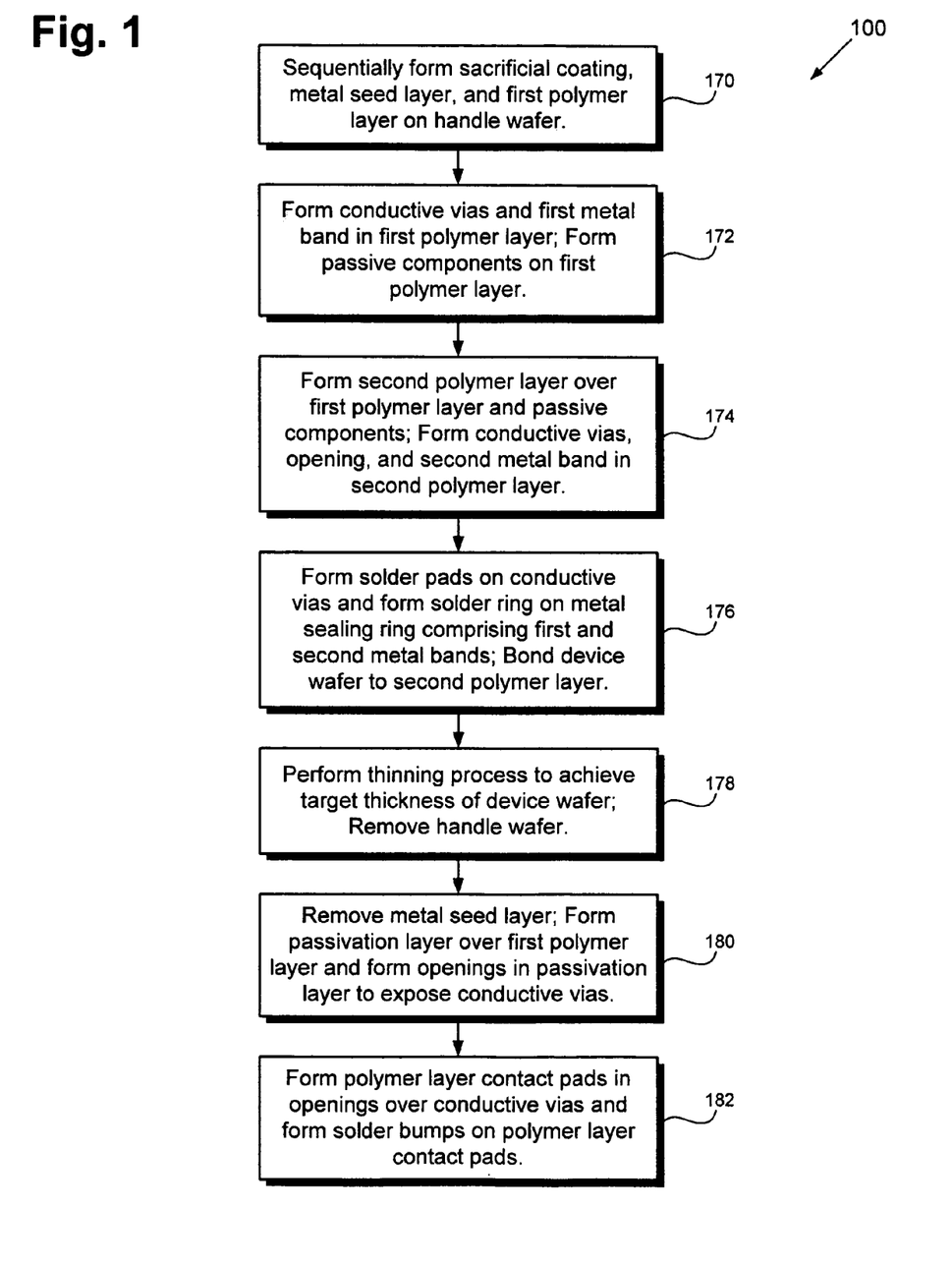
FIG. 1 shows a flowchart illustrating the steps taken to implement an embodiment of the present invention.

FIG. 1 shows a flow chart illustrating an exemplary method according to an embodiment of the present invention. Certain details and features have been left out of flowchart 100 that are apparent to a person of ordinary skill in the art. For example, a step may consist of one or more substeps or may involve specialized equipment or materials, as known in the art. Steps 170 through 182 indicated in flowchart 100 are sufficient to describe one embodiment of the present invention; other embodiments of the invention may utilize steps different from those shown in flowchart 100.

Moreover, structures 270 through 282 in FIGS. 2A through 2G illustrate the result of performing steps 170 through 182 of flowchart 100, respectively. For example, structure 270 shows a semiconductor structure after processing step 170, structure 272 shows structure 270 after the processing of step 172, structure 274 shows structure 272 after the processing of step 174, and so forth.

Figure 2A:
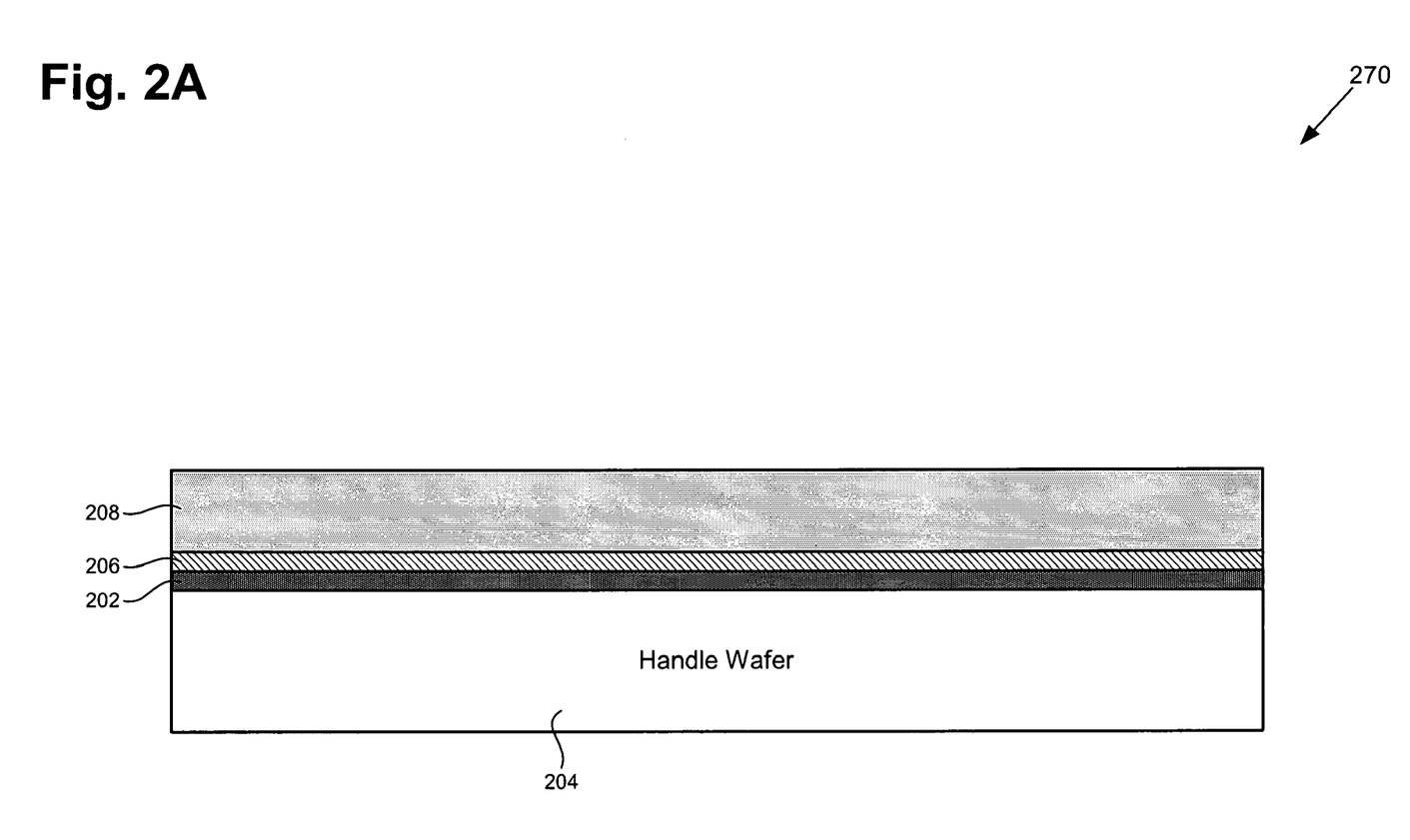
FIG. 2A illustrates a cross-sectional view, which includes a portion of a wafer processed according to an embodiment of the invention, corresponding to an initial step in the flowchart in FIG. 1.

Referring now to step 170 in FIG. 1 and structure 270 in FIG. 2A, at step 170 of flowchart 100, sacrificial coating 202 is formed on handle wafer 204, metal seed layer 206 is formed on sacrificial coating 202, and polymer 208 is formed on metal seed layer 206. Handle wafer 204 is utilized as a platform on which to fabricate a portion of the present invention's wafer level package. Handle wafer 204 can comprise silicon or glass and is removed in a subsequent process step. Sacrificial coating 202 is situated on handle wafer 204 and can comprise a polymer that can be decomposed by application of heat. In other embodiments, sacrificial coating 202 may comprise a polymer that can be decomposed by ultra violet (UV) light or a polymer that can be dissolved in a chemical solution.

In one embodiment, sacrificial coating 202 may comprise photoresist, which can be removed with a photoresist stripper. By way of example, sacrificial coating 202 can have a thickness of between approximately 2.0 microns and approximately 50.0 microns. Sacrificial coating 202 can be formed on handle wafer 204 by using a spin coating process or other appropriate processes. In one embodiment, sacrificial coating 202 may comprise a dry film tape, which can be laminated on handle wafer 204.

Metal seed layer 206 is situated on sacrificial coating 202 and can comprise titanium, titanium tungsten, copper, gold, chrome, titanium nitride, or other appropriate metal or metal alloy. By way of example, metal seed layer 206 can have a thickness of between approximately 0.1 micron and approximately 2.0 microns. Metal seed layer 206 can be formed on sacrificial coating 202 by using a sputtering process, a chemical vapor deposition (CVD) process, a physical vapor deposition (PVD) process, or other appropriate process. Polymer layer 208 is situated on metal seed layer 206 and can comprise a photoimageable polymer, such as benzocyclobutene (BCB), SU-8 (an epoxy-based negative resist), or one of the polyimide family of chemical structures. In one embodiment, polymer layer 208 may comprise a photoimageable epoxy. By way of example, polymer layer 208 can have a thickness of between approximately 30.0 microns and approximately 70.0 microns. Polymer layer 208 can be formed on metal seed layer 206 by using a spin coating process, a spraying process, a screen printing process, or other appropriate process. The result of step 170 of flowchart 100 is illustrated by structure 270 in FIG. 2A.

Figure 2B:
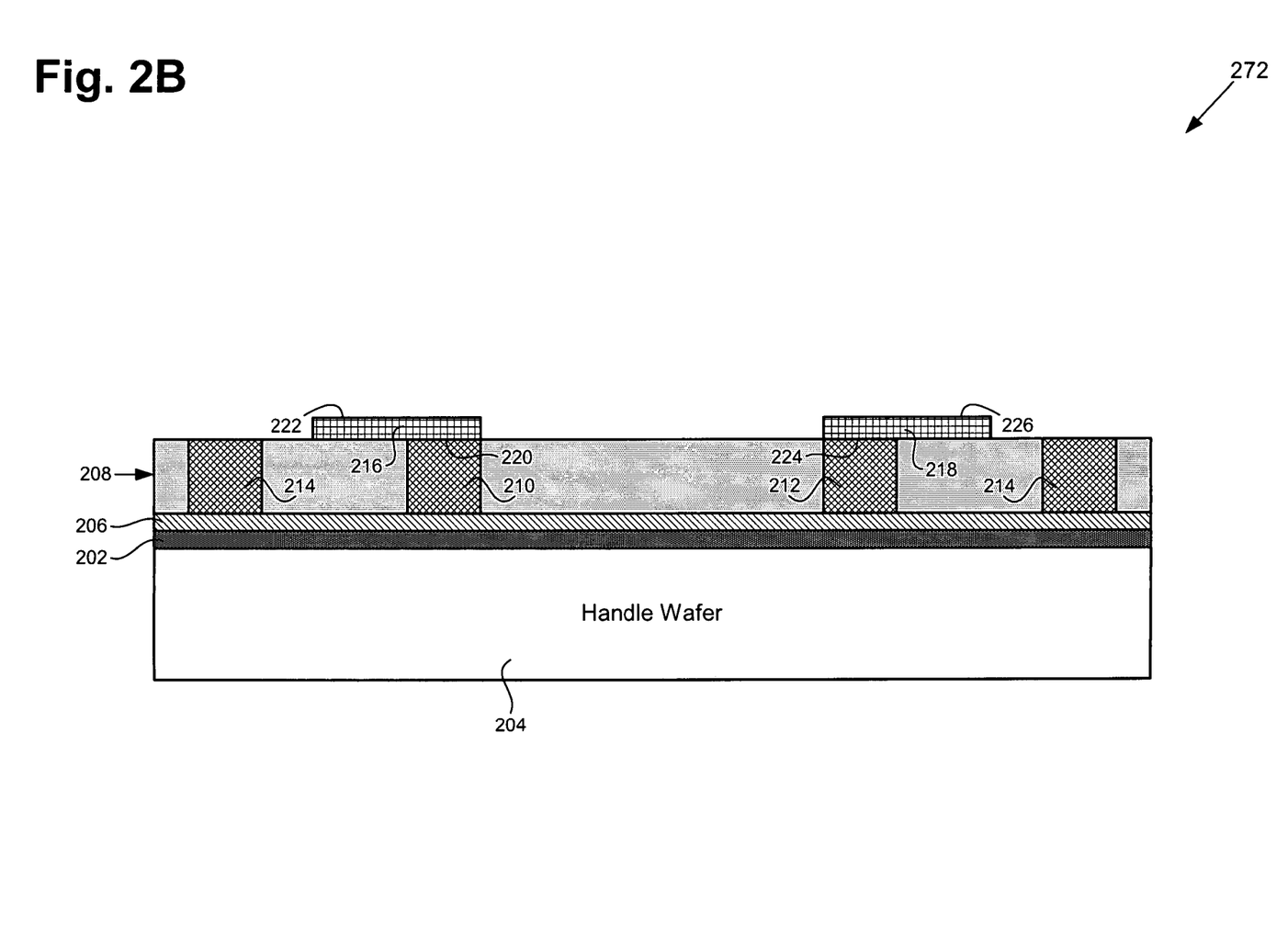
FIG. 2B illustrates a cross-sectional view, which includes a portion of a wafer processed according to an embodiment of the invention, corresponding to an intermediate step in the flowchart in FIG. 1.

Referring to step 172 in FIG. 1 and structure 272 in FIG. 2B, at step 172 of flowchart 100, conductive vias 210 and 212 and metal band 214 are formed in polymer layer 208 and passive components 216 and 218 are formed on polymer layer 208. Conductive vias 210 and 212 are situated in and extend through polymer layer 208 and can comprise a conductive material, such as copper, gold, nickel, a solder material, such as a tin-based solder material, or other appropriate metal or metal alloy. Conductive vias 210 and 212 can be formed by patterning via openings on polymer layer 208 and extending the via openings through polymer layer 208 by utilizing a reactive ion etch (RIE) process, a wet etch process, or other appropriate etch process. An electroless plating process, an electro-plating process, a screen printing process, or other appropriate deposition process can then be used to fill the via openings with conductive material to form conductive vias 210 and 212.

Metal band 214 is situated in and extends through polymer layer 208 and forms a continuous metal loop that extends along the perimeter of polymer layer 208. Metal band 214 can comprise copper, gold, nickel, a solder material, such as a tin-based solder material, or other appropriate metal or metal alloy. Metal band 214 can be formed by patterning and etching a trench in polymer layer 208. An electroless plating process, an electro-plating process, or other appropriate deposition process can then be used to fill the trench with an appropriate metal or metal alloy to form metal band 214.

Passive component 216 is situated on polymer layer 208 and has terminal 220, which is situated over and in electrical contact with conductive via 210, and terminal 222. Passive component 216 can be a resistor, an inductor, or a capacitor and can comprise a metal such as tungsten or other appropriate metallic material. Passive component 218 is situated on polymer layer 208 and has terminal 224, which is situated over and in electrical contact with conductive via 212, and terminal 226. Passive component 218 can be a resistor, an inductor, or a capacitor and can comprise a metal such as tungsten or other appropriate metallic material. Passive components 216 and 218 can be formed by depositing a redistribution layer comprising tungsten or other appropriate metallic material over polymer layer 208 and appropriately patterning and etching the redistribution layer. The result of step 172 of flowchart 100 is illustrated by structure 272 in FIG. 2B.

Figure 2C:
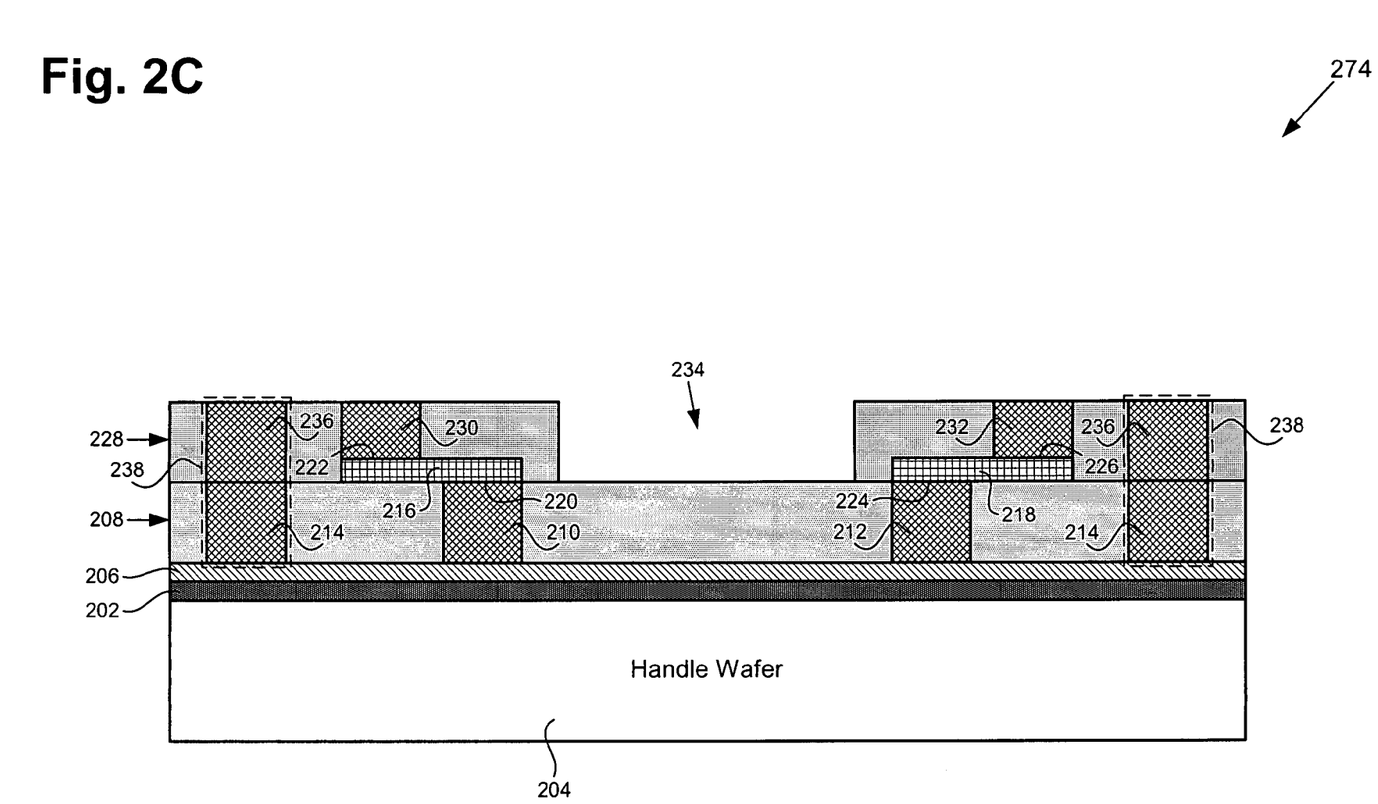
FIG. 2C illustrates a cross-sectional view, which includes a portion of a wafer processed according to an embodiment of the invention, corresponding to an intermediate step in the flowchart in FIG. 1.

Referring to step 174 in FIG. 1 and structure 274 in FIG. 2C, at step 174 of flowchart 100, polymer layer 228 is formed over polymer layer 208 and passive components 216 and 218 and conductive vias 230 and 232, opening 234, and metal band 236 are formed in polymer layer 228. Polymer layer 228 is situated over polymer layer 208 and passive components 216 and 218 and can comprise a photoimageable polymer, such as BCB, SU-8, or one of the polyimide family of chemical structures. In one embodiment, polymer layer 228 may comprise a photoimageable epoxy. In the present embodiment, polymer layer 228 and polymer layer 208 can comprise the same material. In one embodiment, polymer layer 228 and polymer layer 208 can comprise different materials. By way of example, polymer layer 228 can have a thickness of between approximately 5.0 microns and approximately 70.0 microns. Polymer layer 228 can be formed over polymer layer 208 and passive components 216 and 218 by using a spin coating process, a spraying process, a screen printing process, or other appropriate process.

Conductive vias 230 and 232 are situated in polymer layer 228 and over respective passive components 216 and 218. Conductive via 230 is situated over and in electrical contact with terminal 222 of passive component 216 and conductive via 232 is situated over and in electrical contact with terminal 226 of passive components 218. Conductive vias 230 and 232 are substantially similar in composition and formation to conductive vias 210 and 214. Opening 234 is situated in polymer layer 228 between conductive vias 230 and 232 and can be formed by appropriately patterning and etching polymer layer 228. Metal band 236 is situated in and extends through polymer layer 228 and is also situated on metal band 214. Metal band 236 forms a continuous metal loop that extends along the perimeter of polymer layer 228 and is substantially similar in composition, thickness, and formation to metal band 214 in polymer layer 208. Metal band 236 and metal band 214 form metal sealing ring 238, which forms a continuous metal loop that is situated in extends polymer layer 208 and polymer layer 228 and surrounds conductive vias 210, 212, 230, and 232 and passive components 216 and 218. The result of step 174 of flowchart 100 is illustrated by structure 274 in FIG. 2C.

Figure 2D:
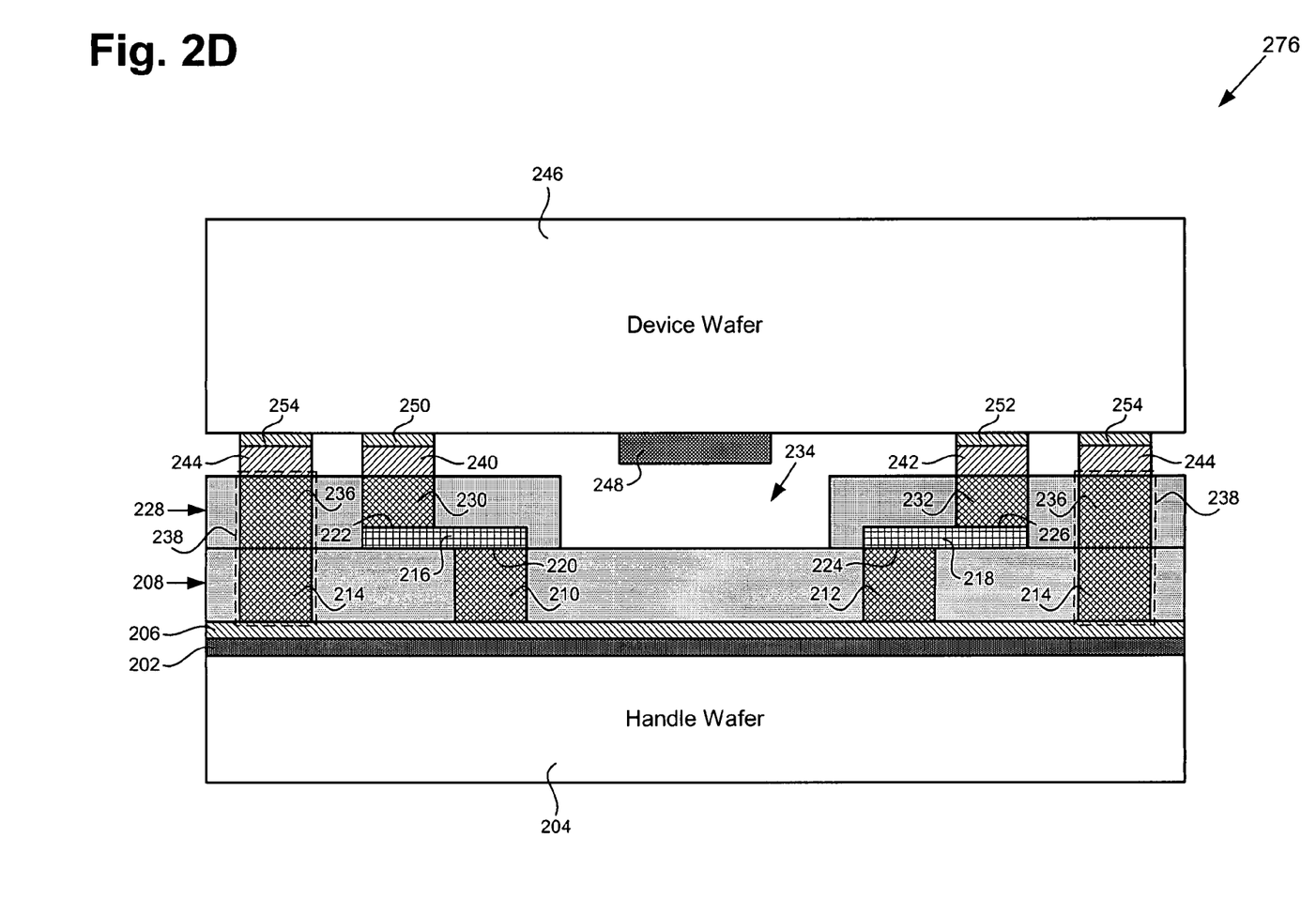
FIG. 2D illustrates a cross-sectional view, which includes a portion of a wafer processed according to an embodiment of the invention, corresponding to an intermediate step in the flowchart in FIG. 1.

Referring to step 176 in FIG. 1 and structure 276 in FIG. 2D, at step 176 of flowchart 100, solder pads 240 and 242 are formed on respective conductive vias 230 and 232, solder ring 244 is formed on metal sealing ring 238, and device wafer 246 is bonded to polymer layer 228. Solder pads 240 and 242 are situated on respective conductive vias 230 and 232 in polymer layer 228 and can comprise a solder material such as tin-silver-copper, tin-silver, gold-tin, indium, or other appropriate solder material having a low-temperature melting point. Solder pads 240 and 242 can be formed on respective conductive vias 230 and 232 by using a plating process or other appropriate deposition process. Solder ring 244 is situated on metal sealing ring 238 and is substantially similar in composition, thickness, and formation to solder pads 240 and 242.

Device wafer 246, which can comprise silicon and/or silicon-germanium, GaAs, InP, InGaP, and/or other materials, is situated over polymer layer 228 and includes device 248, device wafer contact pads 250 and 252, and metal device wafer ring 254. Device 248, which can comprise an IC, such as an RF IC, is situated on device wafer 246 and also situated over opening 234, which forms a cavity for device 248. In one embodiment, device 248 can comprise a MEMS device, such as an RF MEMS device. Device wafer contact pads 250 and 252 are situated on device wafer 246 and are electrically connected to device 248 and also electrically connected to terminals 222 and 226 of passive components 216 and 218, respectively. Metal device wafer ring 254 is situated on device wafer 246 and forms a continuous metal loop that extends along the perimeter of device wafer 246 and surrounds device wafer contact pads 250 and 252 and device 248. Metal device wafer ring 254 can be connected to ground in device wafer 246. In one embodiment, metal device wafer ring 254 may not be connected to ground in device wafer 246.

Device wafer contact pads 250 and 252 and metal device wafer ring 254 can comprise copper, aluminum, or other appropriate metal or metal alloy and can be formed on device wafer 246 in a manner known in the art. It is noted that although a device wafer including only one device and two device contact pads is specifically discussed herein to preserve brevity, the device wafer may include a large number of device contact pads and multiple devices. Device wafer 246 can be bonded to polymer layer 228 by using solder pads 240 and 242 to solder conductive vias 230 and 232 to device wafer contact pads 250 and 252, respectively, and by using solder ring 244 to solder metal sealing ring 238 to device wafer metal ring 254. The result of step 176 of flowchart 100 is illustrated by structure 276 in FIG. 2D.

Figure 2E:
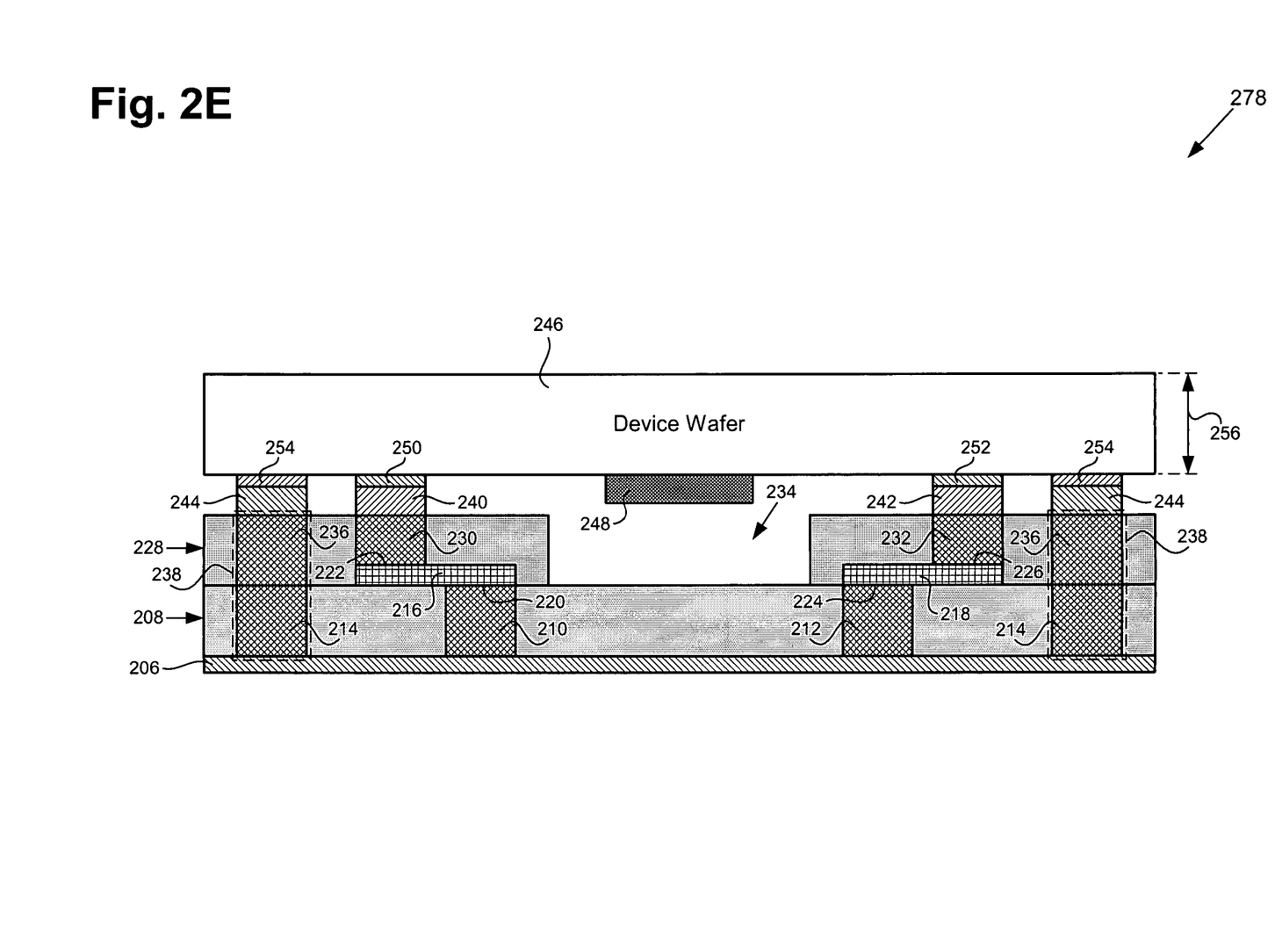
FIG. 2E illustrates a cross-sectional view, which includes a portion of a wafer processed according to an embodiment of the invention, corresponding to an intermediate step in the flowchart in FIG. 1.

Referring to step 178 in FIG. 1 and structure 278 in FIG. 2E, at step 178 of flowchart 100, a thinning process is performed to achieve target thickness 256 of device wafer 246 and handle wafer 204 is removed from metal seed layer 206. By way of example, target thickness 256 of device wafer 246 can be between approximately 50.0 microns and approximately 300.0 microns. In the thinning process, target thickness 256 of device wafer 246 can be achieved by removing a sufficient amount of material from device wafer 246. The thinning process can comprise a grinding process, a chemical mechanical polishing (CMP) process, an etching process, or other appropriate material removal process. Handle wafer 204 (shown in FIGS. 2A through 2D) can be removed from metal seed layer 206 by decomposing sacrificial coating 202 (shown in FIGS. 2A and 2D) in an appropriate process such that handle wafer 204 is released from metal seed layer 206. In the present embodiment, sacrificial coating 202 can be decomposed in a heating process to release handle wafer 204 from metal seed layer 206. In other embodiments, sacrificial coating 202 may be decomposed by using UV light or a chemical solution. After the removal of handle wafer 204, any portion of sacrificial coating 202 remaining on metal seed layer 206 can be removed by using a wet or a dry etch process. The result of step 178 of flowchart 100 is illustrated by structure 278 in FIG. 2E.

Figure 2F:
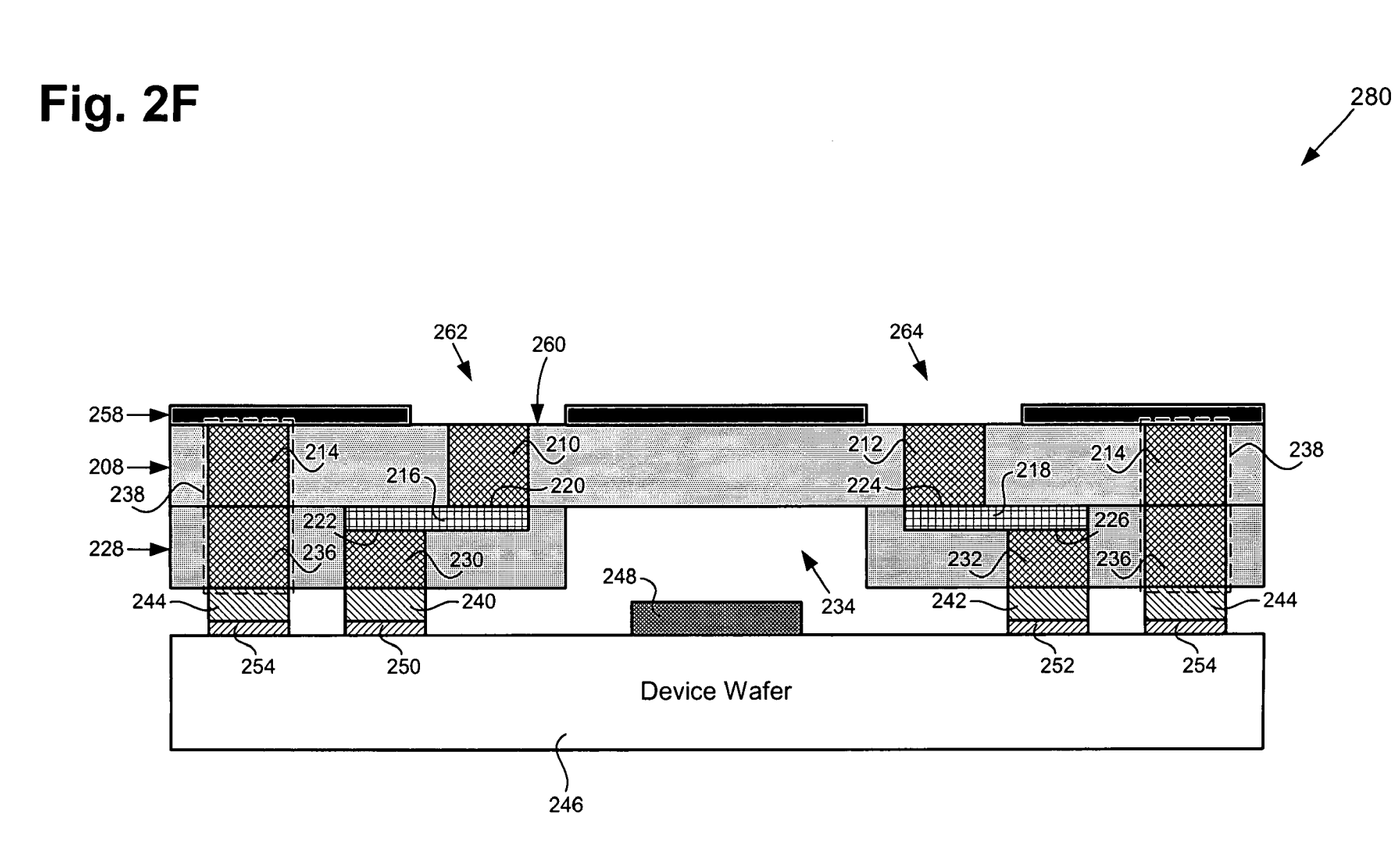
FIG. 2F illustrates a cross-sectional view, which includes a portion of a wafer processed according to an embodiment of the invention, corresponding to a final step in the flowchart in FIG. 1.

Referring to step 180 in FIG. 1 and structure 280 in FIG. 2F, at step 180 of flowchart 100, metal seed layer 206 is removed from polymer layer 208, passivation layer 258 is formed on exposed surface 260 of polymer layer 208, and openings 262 and 264 are formed passivation layer 258 to expose respective conductive vias 210 and 212. Metal seed layer 206 (shown in FIGS. 2A through 2E) can be removed by using a wet or a dry etch process to expose surface 260 of polymer layer 208. Passivation layer 258 is situated on surface 260 of polymer layer 208 and can comprise silicon dioxide, silicon nitride, or other appropriate dielectric material. Passivation layer 258 can be formed on polymer layer 208 by using a CVD process, a plasma enhanced chemical vapor deposition (PECVD) process, or other appropriate low temperature deposition process. Passivation layer 258 can have a thickness less than approximately 1.0 micron. In one embodiment, passivation layer 258 can have a thickness of between a few tenths of a nanometer and a few hundred nanometers. Openings 262 and 264 are situated over and expose respective conductive vias 210 and 212 and can be formed by appropriately patterning and etching passivation layer 258. Passivation layer 258 and metal sealing ring 238 provide a hermetic seal for the present invention's wafer level package. In an embodiment of the present invention that does not require a hermetically sealed wafer level package, passivation layer 258 and/or metal sealing ring 238 may not be used. The result of step 180 of flowchart 100 is illustrated by structure 280 in FIG. 2F.

Figure 2G:
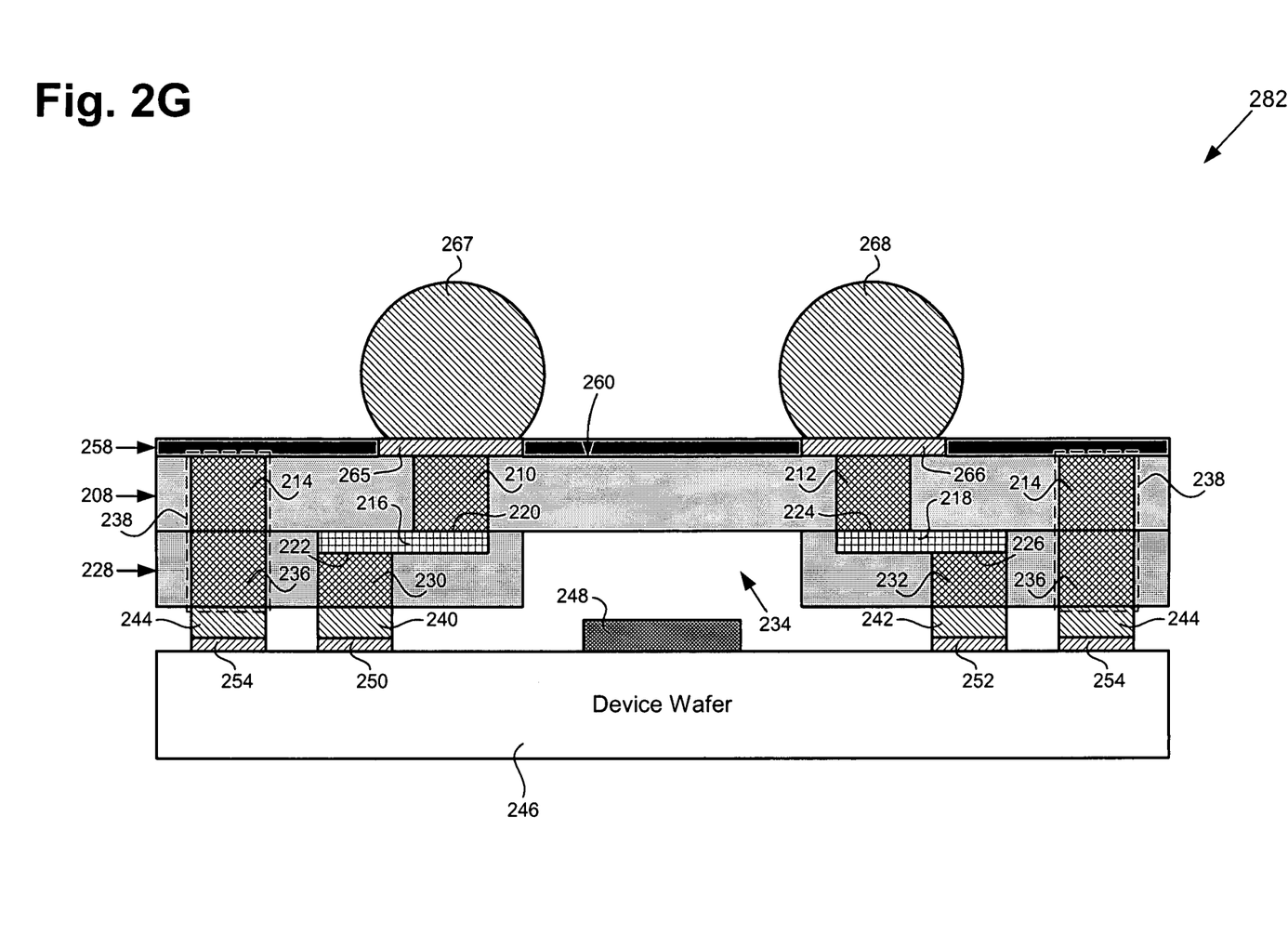
FIG. 2G illustrates a cross-sectional view, which includes a portion of a wafer processed according to an embodiment of the invention, corresponding to a final step in the flowchart in FIG. 1.

Referring to step 182 in FIG. 1 and structure 282 in FIG. 2G, at step 182 of flowchart 100, polymer layer contact pads 265 and 266 are formed over respective conductive vias 210 and 212 and solder bumps 267 and 268 are formed on respective polymer layer contact pads 265 and 266. Polymer layer contact pads 265 and 266 are situated on respective conductive vias 210 and 212 and can comprise a portion of an under bump metallization (UBM) layer, which can comprise nickel, copper, vanadium, or other appropriate metal or metal alloy. Polymer layer contact pads 265 and 266 can be formed by depositing a UBM layer over conductive vias 210 and 212 and passivation layer 258 by using a PVD process or other appropriate deposition process and appropriately patterning and etching the UBM layer. Polymer layer contact pad 265 is electrically connected to terminal 220 of passive component 216 by conductive via 210 and polymer layer contact pad 266 is electrically connected to terminal 224 of passive component 218 by conductive via 212.

Solder bumps 267 and 268 are situated on respective polymer layer contact pads 265 and 266 and can comprise an appropriate solder material. Solder bumps 267 and 268 can provide electrical connectivity between polymer layer contact pads 265 and 266 and devices and components external to the present invention's wafer level package, which houses device 248 and passive components 216 and 218. In one embodiment, wire bonds may be used in place of solder bumps 267 and 268 to provide electrical connectivity between polymer layer contact pads 265 and 266 and devices and components external to the present invention's wafer level package. The result of step 182 of flowchart 100 is illustrated by structure 282 in FIG. 2G.

Thus, as discussed above, the present invention advantageously achieves a wafer level package that includes passive components that are situated between polymer layers, which are situated over a device wafer, where the passive components can be connected to device wafer contact pads and also connected to external components and devices by polymer layer contact pads. By forming passive components between polymer layers that are formed over a device wafer, the present invention effectively integrates passive components with a device wafer in a wafer level package without undesirably increasing the package footprint.

Additionally, by forming a metal sealing ring in the polymer layers and a passivation layer over the polymer layers, the present invention advantageous achieves a hermetically sealed wafer level package having reduced cost compared to a conventional hermetically sealed wafer level package that achieves a hermetic seal by bonding a cap wafer to a device wafer with a metallic bonding material. From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

Thus, a wafer level package including a device wafer integrated with a passive component has been described.

The invention claimed is:

1. A wafer level package comprising:
   a device wafer, said device wafer comprising at least one device wafer contact pad and at least one device, said at least one device wafer contact pad being electrically connected to said at least one device;
   a first polymer layer situated over said device wafer;
   at least one passive component situated over said first polymer layer, said at least one passive component having a first terminal and a second terminal;
   wherein said first terminal of said at least one passive component is electrically connected to said at least one device wafer contact pad;
   wherein said first polymer layer comprises an opening; and
   wherein said opening forms a cavity for said at least one device.

2. The wafer level package of claim 1 further comprising a second polymer layer situated over said at least one passive component.

3. The wafer level package of claim 2 further comprising at least one polymer layer contact pad situated over said second polymer layer, wherein said at least one polymer layer contact pad is electrically connected to said second terminal of said at least one passive component.

4. The wafer level package of claim 2 further comprising a metal seal ring situated in said first polymer layer and said second polymer layer.

5. The wafer level package of claim 2 further comprising a first conductive via situated in said first polymer layer, wherein said first conductive via electrically connects said first terminal of said at least one passive component to said at least one device wafer contact pad.

6. The wafer level package of claim 5 further comprising a second conductive via situated in said second polymer layer, wherein said second conductive via is electrically connected to said second terminal of said at least one passive component.

7. The wafer level package of claim 4 wherein said device wafer further comprises a metal device wafer ring, wherein said metal device wafer ring surrounds said at least one device, wherein said metal device wafer ring is connected to said metal seal ring.

8. The wafer level package of claim 4 further comprising a passivation layer situated over said second polymer layer, wherein said passivation layer and said metal seal ring provide a hermetic seal for said wafer level package.

9. The wafer level package of claim 1 further comprising a solder bump, wherein said solder bump is situated on said at least one polymer layer contact pad.

10. The wafer level package of claim 1, wherein said at least one device wafer contact pad is soldered to at least one conductive via.

11. The wafer level package of claim 2, wherein said cavity includes no polymer material from said first polymer layer or from said second polymer layer.

12. The wafer level package of claim 2, wherein said first polymer layer comprises a different material from said second polymer layer.

13. The wafer level package of claim 12, wherein said at least one passive component is positioned at an interface between said first polymer layer and said second polymer layer.

14. The wafer level package of claim 2, wherein said cavity is defined by a space between said device wafer and said first polymer layer and a space between said device wafer and said second polymer layer with no intervening layer present in said space between said device wafer and said first polymer layer or said space between said device wafer and said second polymer layer.

15. The wafer level package of claim 7, wherein said metal device wafer ring is connected to ground in said device wafer.

16. The wafer level package of claim 7, wherein said metal device wafer ring is soldered to said metal seal ring.

* * * * *